(12) United States Patent
Chen et al.

(10) Patent No.: US 7,685,214 B2
(45) Date of Patent: Mar. 23, 2010

(54) ORDER-PRESERVING ENCODING FORMATS OF FLOATING-POINT DECIMAL NUMBERS FOR EFFICIENT VALUE COMPARISON

(75) Inventors: Yao-Ching Stephen Chen, Saratoga, CA (US); Michael Frederic Cowlishaw, Coventry (GB); Christopher J. Crone, San Jose, CA (US); Fung Lee, Daly City, CA (US); Ronald Morton Smith, Sr., Wappingers Falls, NY (US); Guogen Zhang, San Jose, CA (US); Qinghua Zou, Issaquah, WA (US)

(73) Assignee: International Business Machines Corporation, Armonk, NY (US)

( * ) Notice: Subject to any disclaimer, the term of this patent is extended or adjusted under 35 U.S.C. 154(b) by 1244 days.

(21) Appl. No.: 11/213,551

(22) Filed: Aug. 26, 2005

(65) Prior Publication Data
US 2007/0050436 A1    Mar. 1, 2007

(51) Int. Cl.
*G06F 7/00*     (2006.01)
*G06F 15/00*    (2006.01)
*G06F 7/38*     (2006.01)
*H03M 5/00*     (2006.01)

(52) U.S. Cl. .................. 708/204; 708/495; 341/55
(58) Field of Classification Search ......... 708/204–205, 708/208–209, 490, 495; 341/50–105
See application file for complete search history.

(56) References Cited

U.S. PATENT DOCUMENTS

| | | | | |
|---|---|---|---|---|
| 4,038,538 A | * | 7/1977 | Semmelhaack et al. | 341/75 |
| 5,161,117 A | * | 11/1992 | Waggener, Jr. | 708/204 |
| 5,267,186 A | * | 11/1993 | Gupta et al. | 708/508 |
| 5,548,776 A | | 8/1996 | Colwell et al. | 395/800 |
| 5,752,072 A | | 5/1998 | Agarwal | 395/800.34 |
| 5,923,574 A | * | 7/1999 | Bechade | 708/205 |
| 6,021,488 A | | 2/2000 | Eisen et al. | 712/228 |
| 6,525,679 B1 | * | 2/2003 | Cowlishaw | 341/104 |
| 6,907,435 B2 | * | 6/2005 | Coulson et al. | 707/203 |
| 7,236,995 B2 | * | 6/2007 | Hinds | 708/204 |
| 7,546,328 B2 | * | 6/2009 | Schulte et al. | 708/505 |
| 2006/0047733 A1 | * | 3/2006 | Hervin et al. | 708/204 |
| 2007/0061387 A1 | * | 3/2007 | Carlough et al. | 708/204 |
| 2007/0240129 A1 | * | 10/2007 | Kretzschmar et al. | 717/136 |

(Continued)

OTHER PUBLICATIONS

Michael F. Cowlishaw, "A Decimal Floating-Point Specification", 2001, IEEE.*

(Continued)

*Primary Examiner*—Lewis A Bullock, Jr.
*Assistant Examiner*—Matthew Sandifer
(74) *Attorney, Agent, or Firm*—Stephen J. Walder, Jr.; Elissa Y. Wang

(57) ABSTRACT

A method for conversion between a decimal floating-point number and an order-preserving format has been disclosed. The method encodes numbers in the decimal floating-point format into a format which preserves value ordering. This encoding allows for fast and direct string comparison of two values. Such an encoding provides normalized representations for decimal floating-point numbers and supports type-insensitive comparisons. Type-insensitive comparisons are often used in database management systems, where the data type is not specified for values to compare. In addition, the original decimal floating-point format can be recovered from the order-preserving format.

16 Claims, 13 Drawing Sheets

U.S. PATENT DOCUMENTS

2008/0270499 A1* 10/2008 Lundvall et al. ............ 708/204

OTHER PUBLICATIONS

Michael F. Cowlishaw, "Decimal Floating-Point: Algorism for Computers", 2003, IEEE.*

Michael F. Cowlishaw, "Densely packed decimal encoding", 2002, IEEE.*

IBM Corporation, "z/Architecture Principles of Operation", SA22-7832-01, Oct. 2001.*

* cited by examiner

| Format | decimal32 | decimal64 | decimal128 |
|---|---|---|---|
| Format length | 32 | 64 | 128 |
| Exponent continuation length (ecbits) | 6 | 8 | 12 |
| Coefficient continuation length | 20 | 50 | 110 |
| Coefficient length in digits (CoLen) | 7 | 16 | 34 |
| Maximum Exponent (Emax) | 96 | 384 | 6144 |
| Minimum Exponent (Emin) | -95 | -383 | -6143 |
| Bias | 101 | 398 | 6176 |
| Nmax | $9.999...999 \times 10^{Emax}$ | | |
| Ntiny | $0.000...001 \times 10^{Emin}$ | | |

FIG. 1 (Prior Art)

| Length (bits) | 1 | 5 | 6 | 20 |
|---|---|---|---|---|
| Content | Sign | Combination Field | Exponent continuation | Coefficient continuation |

FIG. 2 (Prior Art)

| Decimal | Normal | Exp | Exp H | Exp L | MSD | Comb | Encoding in 32 bits |
|---|---|---|---|---|---|---|---|
| +NaN | - | - | All 1s | - | - | 31 | 11111111 1111xxxx xxxxxxxx xxxxxxxx |
| -NaN | - | - | All 1s | - | - | 31 | 00000000 0000xxxx xxxxxxxx xxxxxxxx |
| +Inf | - | - | All 1s | - | - | 30 | 11111111 11101111 11111111 11111111 |
| -Inf | - | - | All 1s | - | - | 30 | 00000000 00010000 00000000 00000000 |
| +0 | - | - | All 1s | - | - | 0 | 10000000 00000000 00000000 00000000 |
| -0 | - | - | All 1s | - | - | 0 | 10000000 00000000 00000000 00000000 |
| $7.5*10^{-6}$ | $7.500000*10^{-6}$ | 95 | 31 | 2 | 7 | 27 | 10111111 10110111 11010000 00000000 |
| $-7.5*10^{-6}$ | $-7.500000*10^{-6}$ | 95 | 31 | 2 | 7 | 27 | 01000000 01001000 00101111 11111111 |
| $-8.51*10^{-6}$ | $-8.510000*10^{-6}$ | 95 | 31 | 2 | 8 | 28 | 01000000 00110000 00000111 11111111 |
| $2.3456789*10^3$ | $2.345679*10^3$ | 104 | 34 | 2 | 2 | 22 | 11000101 01100101 01100110 10100111 |
| 2345.678 | $2.345678*10^3$ | 104 | 34 | 2 | 2 | 22 | 11000101 01100101 01100110 10100110 |
| $-0.1234*10^{-98}$ | $-0.000123*10^{-95}$ | 6 | 2 | 0 | 0 | 0 | 01111011 11111111 11111111 10000100 |
| $-1234*10^{-101}$ | $-0.001234*10^{-95}$ | 6 | 2 | 0 | 0 | 0 | 01111011 11111111 11111011 00010101 |

FIG. 5

| Length (bits) | 1 | 1 | 8 | 24 | 6 |
|---|---|---|---|---|---|
| Content | Plus | Non-Zero | Exponent | Normalized Coefficient | Shift Count |

FIG. 6

| Format | 32 bit | 64 bit | 128 bit |
|---|---|---|---|
| Plus | 1 | 1 | 1 |
| Non-Zero | 1 | 1 | 1 |
| Exponent | 8 | 10 | 14 |
| Normalized Coefficient | 24 | 54 | 114 |
| Shift Count | 6 | 6 | 6 |
| Total Bits | 40 | 72 | 136 |
| Total Bytes | 5 | 9 | 17 |

FIG. 7

| Number | PL/NZ | Exponent | 1st Digit BCD | 1st declet | 2nd declet | 3rd declet | 4th declet | 5th declet | Shift Count |
|---|---|---|---|---|---|---|---|---|---|
| 7.5 | 11 | 01 1000 1111 | 0111 | 0111 1101 00 | 00 0000 0000 | 0000 0000 00 | 00 0000 0000 | 0000 0000 00 | 00 1110 (14) |
| 7.50 | 11 | 01 1000 1111 | 0111 | 0111 1101 00 | 00 0000 0000 | 0000 0000 00 | 00 0000 0000 | 0000 0000 00 | 00 1101 (13) |
| 7.500 | 11 | 01 1000 1111 | 0111 | 0111 1101 00 | 00 0000 0000 | 0000 0000 00 | 00 0000 0000 | 0000 0000 00 | 00 1100 (12) |

FIG. 9

```
IF sign bit OFF THEN /*means negative number*/
   tempbuf = inverse all the bits to make it positive number
IF non-zero bit of tempbuf OFF THEN  /*must be 0*/
   resultbuffer = 0 (hardcode normalized 0)
ELSE IF first 7 bits of tempbuf ON THEN /*must be NaN*/
   resultbuffer = NaN (hardcode normalized NaN)
EFLSE IF first 6 bits of tempbuf ON THEN /*must be sNaN*/
   resultbuffer = sNaN (hardcode normalized sNaN)
ELSE IF first 5 bits of tempbuf ON THEN /*must be INF*/
   resultbuffer = INF (hardcode normalized INF)
ELSE DO
   /*must be finite number that's non-0*/
   /*calculate the new shift count of normalize number */
/*Normalize shift count for finite number = max precision for DECFLOAT – precision of the*/
/*coeff = the number of zero digits at the rightmost of coeff*/
   tempbuf shift count divide by 3 to see how many declet we can skip./*
because the declet we shifted pass must be all 0*/
   The number of declet, X, we skip, we know there are at least X*3 zero digits at the right
most of coeff.
   Start from the rightmost declet we didn't skip, convert each declet from binary to 3 digits
and see how much right most zero digits we have totally until we hit a non-zero digit.
   new shift count = the number of zero digits at the rightmost of coeff
   SET the result buffer shift count to the new shift count
END If the result buffer is not 0 /*We don't return -0. This 0 check si not needed if the input can't
be -0*/
   and the origainl DECFLAT sign bit is OFFTHEN /* the original number is non-zero
negative*/
   inverse the resultbuffer to make the result negative
```

FIG. 10

Constants Used In Formulas

| Symbol | Name | Decimal32 | Decimal64 | Decimal128 |
|---|---|---|---|---|
| BXmax | Maximum Biased Exponent | 191 | 767 | 12287 |
| K | Normal Offset | $2^{24}$ (16,777,216) | $2^{56}$ | $2^{120}$ |
| M | Biased Exponent Multiplier | $10 \times 2^{20}$ (10,485,760) | $10 \times 2^{50}$ | $10 \times 2^{110}$ |

Symbols Used

| Symbol | Explanation |
|---|---|
| A | Adjusted coefficient |
| B | Adjusted biased exponent |
| DRCS | Decimal representation of coefficient of source operand |
| G | Decade index |
| K | Normal offset |
| M | Biased exponent multiplier |
| W | Intermediate compact index |

FIG. 12

| Value | DFP Source Operand | | Adjusted DFP Values | | S | Z | G | Intermediate Compact Index (W) | |
|---|---|---|---|---|---|---|---|---|---|
| | c | bx | A | B | | | | Decimal | Binary |
| 7.499999 | 7499999 | 95 | 7499999 | 95 | 56 | 0 | 8333326 | 1021257742 | 0011 1100 1101 1111 0010 1000 0000 1110 |
| 7.500000 | 7500000 | 95 | 7500000 | 95 | 12 | 5 | 8333327 | 1021257743 | 0011 1100 1101 1111 0010 1000 0000 1111 |
| 7.50000 | 0750000 | 96 | 7500000 | 95 | 12 | 4 | 8333328 | 1021257744 | 0011 1100 1101 1111 0010 1000 0001 0000 |
| 7.5000 | 0075000 | 97 | 7500000 | 95 | 12 | 3 | 8333329 | 1021257745 | 0011 1100 1101 1111 0010 1000 0001 0001 |
| 7.500 | 0007500 | 98 | 7500000 | 95 | 12 | 2 | 8333330 | 1021257746 | 0011 1100 1101 1111 0010 1000 0001 0010 |
| 7.50 | 0000750 | 99 | 7500000 | 95 | 12 | 1 | 8333331 | 1021257747 | 0011 1100 1101 1111 0010 1000 0001 0011 |
| 7.5 | 0000075 | 100 | 7500000 | 95 | 12 | 0 | 8333332 | 1021257748 | 0011 1100 1101 1111 0010 1000 0001 0100 |
| 7.500001 | 7500001 | 95 | 7500001 | 95 | 13 | 0 | 8333333 | 1021257749 | 0011 1100 1101 1111 0010 1000 0001 0101 | c   Coefficient (significand of DFP value viewed as an integer).
bx  Biased Exponent (bx = q+bias) where q = exponent corresponding to integer significand.
A   Adjusted Coefficient.
B   Adjusted Biased Exponent.
S   Sum of the decimal digits in the decimal representation of the coefficient.
Z   Number of rightmost zeros in coefficient of the DFP source operand.
G   Decade index; $G = (10*A-S)/9 - Z$.
W   Intermediate Compact Index; $W = K + H*B + G$.

FIG. 13

| G = 1111112 | | | | | |
|---|---|---|---|---|---|
| Step | J | V | Q | D | R |
| 1 | 7 | 10000071 | 1 | 8 | 0000063 |
| 2 | 6 | 10000063 | 0 | 9 | 000054 |
| 3 | 5 | 10000054 | 0 | 9 | 00045 |
| 4 | 4 | 10000045 | 0 | 9 | 0036 |
| 5 | 3 | 10000036 | 0 | 9 | 027 |
| 6 | 2 | 10000027 | 0 | 9 | 18 |
| 7 | 1 | 10000018 | 1 | 8 | 0 |

A = 1000001
Z = 0

| G = 2606305 | | | | | |
|---|---|---|---|---|---|
| Step | J | V | Q | D | R |
| 1 | 7 | 23456808 | 2 | 7 | 3456801 |
| 2 | 6 | 23456801 | 3 | 6 | 456795 |
| 3 | 5 | 23456795 | 4 | 5 | 56790 |
| 4 | 4 | 23456790 | 5 | 4 | 6786 |
| 5 | 3 | 23456786 | 6 | 3 | 783 |
| 6 | 2 | 23456783 | 7 | 2 | 81 |
| 7 | 1 | 23456881 | 8 | 1 | 0 |

A = 2345678
Z = 0

| G = 3490656 | | | | | |
|---|---|---|---|---|---|
| Step | J | V | Q | D | R |
| 1 | 7 | 31415967 | 3 | 6 | 1415961 |
| 2 | 6 | 31415961 | 1 | 8 | 415953 |
| 3 | 5 | 31415953 | 4 | 5 | 15948 |
| 4 | 4 | 31415948 | 1 | 8 | 5940 |
| 5 | 3 | 31415940 | 5 | 4 | 936 |
| 6 | 2 | 31415936 | 9 | 0 | 36 |
| 7 | 1 | 31415936 | 3 | 6 | 0 |

A = 3141593
Z = 0

| G = 10973932 | | | | | |
|---|---|---|---|---|---|
| Step | J | V | Q | D | R |
| 1 | 7 | 98765451 | 9 | 0 | 8765451 |
| 2 | 6 | 98765451 | 8 | 1 | 765450 |
| 3 | 5 | 98765450 | 7 | 2 | 65448 |
| 4 | 4 | 98765448 | 6 | 3 | 5445 |
| 5 | 3 | 98765445 | 5 | 4 | 441 |
| 6 | 2 | 98765441 | 4 | 5 | 36 |
| 7 | 1 | 98765436 | 3 | 6 | 0 |

A = 9876543
Z = 0

| G = 8333326 | | | | | |
|---|---|---|---|---|---|
| Step | J | V | Q | D | R |
| 1 | 7 | 74999997 | 7 | 2 | 4999995 |
| 2 | 6 | 74999995 | 4 | 5 | 999990 |
| 3 | 5 | 74999990 | 9 | 0 | 99990 |
| 4 | 4 | 74999990 | 9 | 0 | 9990 |
| 5 | 3 | 74999990 | 9 | 0 | 990 |
| 6 | 2 | 74999990 | 9 | 0 | 90 |
| 7 | 1 | 74999990 | 9 | 0 | 0 |

A = 7499999
Z = 0

| G = 8333327 | | | | | |
|---|---|---|---|---|---|
| Step | J | V | Q | D | R |
| 1 | 7 | 75000006 | 7 | 2 | 5000004 |
| 2 | 6 | 75000004 | 5 | 4 | 000000 |

A = 7500000
Z = 5

| G = 8333328 | | | | | |
|---|---|---|---|---|---|
| Step | J | V | Q | D | R |
| 1 | 7 | 75000015 | 7 | 2 | 5000013 |
| 2 | 6 | 75000013 | 5 | 4 | 000009 |
| 3 | 5 | 75000009 | 0 | 9 | 00000 |

A = 7500000
Z = 4

| G = 8333329 | | | | | |
|---|---|---|---|---|---|
| Step | J | V | Q | D | R |
| 1 | 7 | 75000024 | 7 | 2 | 5000022 |
| 2 | 6 | 75000022 | 5 | 4 | 000018 |
| 3 | 5 | 75000018 | 0 | 9 | 00009 |
| 4 | 4 | 75000009 | 0 | 9 | 0000 |

A = 7500000
Z = 3

| G = 8333330 | | | | | |
|---|---|---|---|---|---|
| Step | J | V | Q | D | R |
| 1 | 7 | 75000033 | 7 | 2 | 5000031 |
| 2 | 6 | 75000031 | 5 | 4 | 000027 |
| 3 | 5 | 75000027 | 0 | 9 | 00018 |
| 4 | 4 | 75000018 | 0 | 9 | 0009 |
| 5 | 3 | 75000009 | 0 | 9 | 000 |

A = 7500000
Z = 2

| G = 8333331 | | | | | |
|---|---|---|---|---|---|
| Step | J | V | Q | D | R |
| 1 | 7 | 75000042 | 7 | 2 | 5000040 |
| 2 | 6 | 75000040 | 5 | 4 | 000036 |
| 3 | 5 | 75000036 | 0 | 9 | 00027 |
| 4 | 4 | 75000027 | 0 | 9 | 0018 |
| 5 | 3 | 75000018 | 0 | 9 | 009 |
| 6 | 2 | 75000009 | 0 | 9 | 00 |

A = 7500000
Z = 1

| G = 8333332 | | | | | |
|---|---|---|---|---|---|
| Step | J | V | Q | D | R |
| 1 | 7 | 75000051 | 7 | 2 | 5000049 |
| 2 | 6 | 75000049 | 5 | 4 | 000045 |
| 3 | 5 | 75000045 | 0 | 9 | 00036 |
| 4 | 4 | 75000036 | 0 | 9 | 0027 |
| 5 | 3 | 75000027 | 0 | 9 | 018 |
| 6 | 2 | 75000018 | 0 | 9 | 09 |
| 7 | 1 | 75000009 | 0 | 9 | 0 |

A = 7500000
Z = 0

| G = 8333333 | | | | | |
|---|---|---|---|---|---|
| Step | J | V | Q | D | R |
| 1 | 7 | 75000060 | 7 | 2 | 5000058 |
| 2 | 6 | 75000058 | 5 | 4 | 000054 |
| 3 | 5 | 75000054 | 0 | 9 | 00045 |
| 4 | 4 | 75000045 | 0 | 9 | 0036 |
| 5 | 3 | 75000036 | 0 | 9 | 027 |
| 6 | 2 | 75000027 | 0 | 9 | 18 |
| 7 | 1 | 75000018 | 1 | 8 | 0 |

ORDER-PRESERVING ENCODING FORMATS OF FLOATING-POINT DECIMAL NUMBERS FOR EFFICIENT VALUE COMPARISON

FIELD OF THE INVENTION

The present invention relates to encoding formats of floating-point decimal numbers, and more specifically to an encoding format which preserves the order for efficient value comparisons.

BACKGROUND OF THE INVENTION

Most computers today support binary floating-point in hardware. While suitable for many scientific applications, binary floating-point arithmetic is inadequate for financial, commercial, and user-centric applications or web services because the decimal data used in these applications cannot be represented exactly using binary floating-point. The problems of binary floating-point can be avoided by using base 10 (decimal) exponents and preserving those exponents where possible. The Decimal Arithmetic Specification defines a general purpose floating-point decimal arithmetic, which allows fixed-point and integer decimal arithmetic as a subset. These decimal floating-point (DFP) encodings are proposed by the IEEE 754r committee and currently included in the proposed IEEE-SA 754r standard, are:

A decimal32 number, which is encoded in four consecutive bytes (32 bits);

A decimal64 number, which is encoded in eight consecutive bytes (64 bits); and

A decimal128 number, which is encoded in 16 consecutive bytes (128 bits).

To compare two values, the above encodings require decoding the two values into general decimal representations before comparing, and thus are not efficient for value comparison purposes. Value comparison is used extensively in database systems for features such as sorting.

Accordingly, there exists a need for a floating-point decimal encoding scheme which preserves the ordering of the underlying values, and thus allow for value comparison of two values without requiring the decoding of the two values into general decimal representations. The present invention addresses such a need.

SUMMARY OF THE INVENTION

A method for conversion between a decimal floating-point number and an order-preserving format has been disclosed. The method encodes numbers in the decimal floating-point format into a format which preserves value ordering. This encoding allows for fast and direct string comparison of two values. Such an encoding provides normalized representations for decimal floating-point numbers and supports type-insensitive (binary) comparisons. Type-insensitive comparisons are often used in database management systems, where the data type is not specified for values to compare. In addition, the original decimal floating-point format can be recovered from the order-preserving format.

BRIEF DESCRIPTION OF THE FIGURES

FIG. 1 illustrates parameters for three decimal floating-point formats.

FIG. 2 illustrates a length and content of the fields in the decimal32 format.

FIG. 5 illustrates examples of the decoding and encoding schemes in accordance with the first embodiment of the present invention.

FIG. 6 illustrates the length and content of the fields for a decimal32 conversion in accordance with the second embodiment of the encoding scheme of the present invention.

FIG. 7 is a chart illustrating the field size in bits for the corresponding IEEE 754r formats in accordance with the second embodiment of the encoding scheme of the present invention.

FIG. 9 illustrates the 64-bit order-preserving format for numbers 7.5, 7.50, and 7.500 in accordance with the second embodiment of the present invention.

FIG. 10 illustrates an example pseudo-code for normalizing an order-preserving format to the shortest coefficient.

FIG. 12 illustrates values of the normal offset and the biased exponent multiplier for each DFP format in accordance with the third embodiment of the present invention.

FIG. 13 shows examples of encoding the six members of the cohort for the value 7.5, and the two nearest values, in the decimal32 format in accordance with the third embodiment of the present invention.

FIG. 15, using the decimal32 format, gives several examples of deriving A and Z from G in accordance with the third embodiment of the present invention.

DETAILED DESCRIPTION

Figure 3:
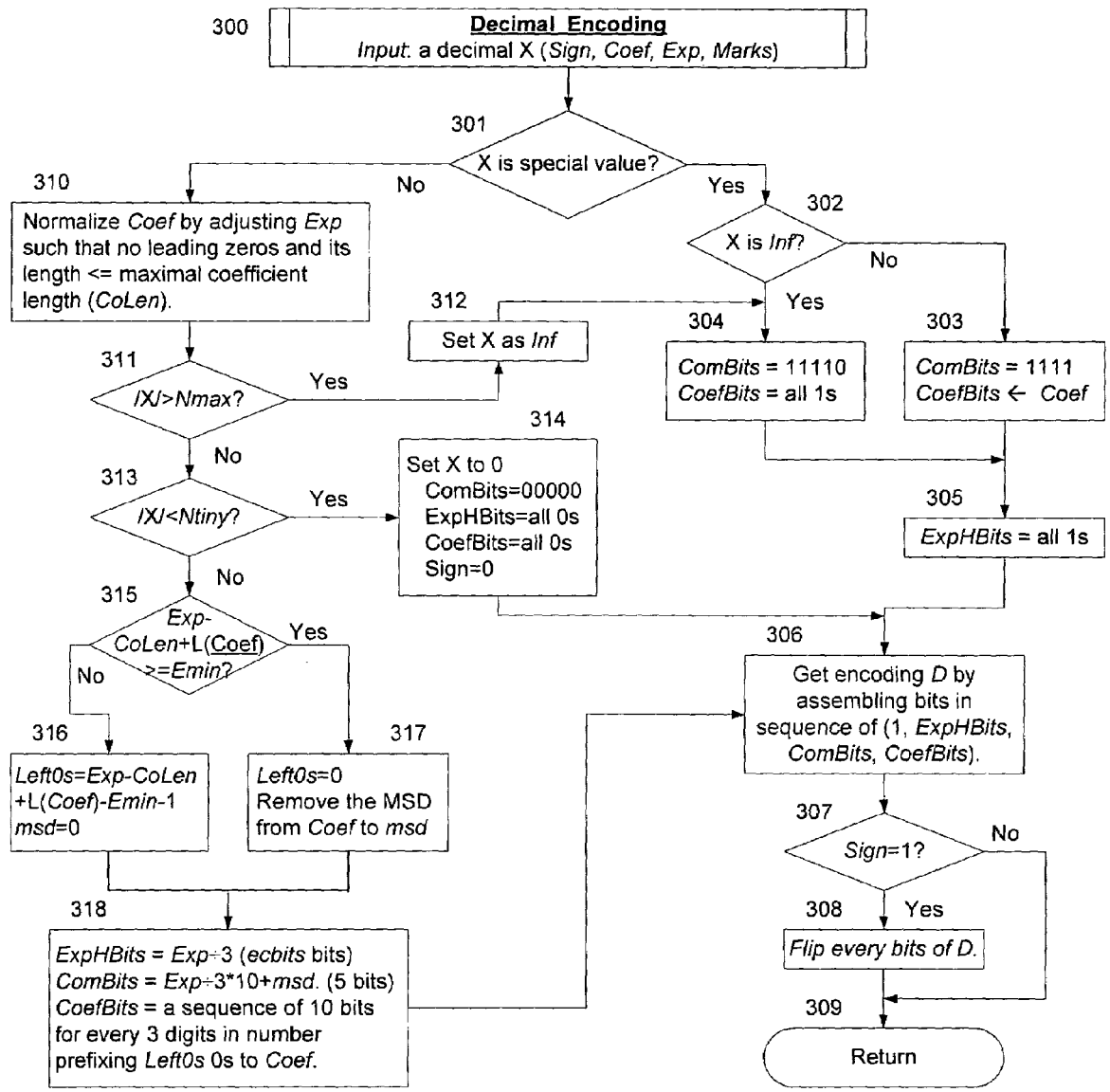
FIG. 3 is a flowchart illustrating a first embodiment of the order-preserving encoding scheme in accordance with the present invention, to encode an arbitrary decimal number into an order-preserving format.

The present invention provides an order-preserving encoding scheme for floating-point decimal numbers. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 1 through 11 in conjunction with the discussion below.

IEEE 754r Encodings

The encodings in IEEE 754r allow for a range of positive and negative values, together with values of ±0, ±infinity, and Not-a-Number (NaN). The finite numbers are defined by a sign, an exponent (which is a power of ten), and a decimal integer coefficient. The value of a finite number is given by $(-1)^{sign} \times \text{coefficient} \times 10^{exponent}$. For example, if the sign has a value of '1', the exponent has the value of '−1', and the coefficient has a value of '25', then the value of the number is '−2.5'. This dual integer description of numbers permits redundant encodings of some values. For example, if the sign has the value of '1', the exponent has the value of '−2', and the coefficient has the value of '250', then the numerical value of this number is also '−2.5'.

In the encoding of these dual-integer numbers, the sign is a single bit. The exponent is encoded as an unsigned binary integer from which a bias is subtracted to allow both negative and positive exponents. The coefficient is an unsigned decimal integer, with each complete group of three digits encoded in 10 bits. Given the length of the coefficient and possible values for the encoded exponent, the maximum positive exponent (Emax) and bias can be derived, as illustrated in FIG. 1.

For the decimal32 format, the largest normal number (Nmax) is $9.999999 \times 10^{Emax}$. Of these positive numbers, the number $1 \times 10^{Emin}$ (and its redundant encodings) is the smallest normal number, and $0.000001 \times 10^{Emin}$ (which has no redundant encoding) is the smallest subnormal number (Ntiny). Note that the numbers with the same 'scale' (such as 1.23 and 123.45) have the same encoded exponent.

As illustrated in FIG. 1, each format has a coefficient whose length is a multiple of three, plus one. One digit of the coefficient (the most significant) cannot be included in a 10-bit group and instead is combined with the two most significant digits of the exponent into a 5-bit combination field. This scheme is more efficient than keeping the exponent and coefficient separated, and increases the exponent range available by about 50%. The combination field requires 30 states out of a possible 32 for the finite numbers; the other two states are used to identify the special values.

FIG. 2 illustrates the length and content of the fields in the decimal32 format. It has a 1-bit sign field, a 5-bit combination field, a 6-bit exponent continuation field, and a 20-bit coefficient continuation field. Because some digits of the coefficient and the exponent are combined into the combination field, direct byte-wise comparison cannot be performed for two values. The length and content of the fields in the decimal64 and decimal128 formats are similarly determined so are not described here.

FIG. 3 is a flowchart illustrating a first embodiment of the order-preserving encoding scheme in accordance with the present invention, to encode an arbitrary decimal number into an order-preserving format. The input decimal X contains information about sign, coefficient (Coef), exponent (Exp), and marks for special values, via step 300.

The marks of X are checked to see if X is a special value, in step 301. If it is a special value, then X is scheduled to see if it is an Infinitive (Inf), via step 302. If it is Inf, then the combination field is set to '30' in step 303, and its coefficient field is set to all 1s. Otherwise, the combination field is set to '31' (for NaN), via step 304, and the coefficient field reflects the bits of Coef (default value is all is) in step 304.

In step 310, X is normalized so that its coefficient doesn't exceed the maximal coefficient length CoLen. In step 311, X is tested to see if it is larger than the largest decimal, Nmax. If yes, then it is too large for the targeting format, and it is treated as Inf in step 312. In step 313, X is tested to see if it is less than the least decimal, Nmin. If yes, then it is treated as zero in step 314. Steps 315, 316, and 317 are for bounded normalization, which normalize the coefficient while keeping the exponent no less than the minimum possible exponent (Emin). When scaling up the coefficient with 10 to the power of CoLen−L (Coef), where L(Coef) is the number of digits in Coef, the Exp will correspondingly change to Exp−CoLen+L(Coef). If the updated Exp is greater than or equal to Emin, the first digit of the coefficient will be removed from the Coef to the most significant digit (msd) as in step 317. Otherwise, msd is 0 and the Coef is prefixed with Exp−CoLen+L(Coef)−Emin−1 0s, as in step 316. Step 318 calculates the exponent high bits (ExpHBits), combination field (ComBits), and coefficient continuation bits (CoefBits). The ExpHBits is the exponent divided by three. The ComBits has the value 0, 1, or 2, combined with the msd in 5 bits. Note that in the above normalizing steps a decimal does not actually shift coefficient digits. Instead, the number of zeros required to prefix the coefficient is calculated. Thus the normalization step is very efficient.

Encoding the CoefBits is to group the Coef digits into groups of three digits, where each group of three digits is mapped to 10 bits. When the number of digits in a unit of a decimal is 3 and msd is grouped by itself, each unit can be directly mapped into 10 bits without re-grouping. For other cases, re-grouping is required which only needs a small number of divisions and multiplications of 10, 100, or 1000. Encoding exponent only involves a division by 3. Given that the efficient conversion between Decimal and the hardware encodings (decimal32, decimal64, decimal128) also needs multiply operations, the efficiency of the above encoding is acceptable. Decoding has the similar time complexity.

In Step 306, the above bits are assembled with the sign bit set to 1. Step 307 checks if X is negative. If X is negative, every bit in the encoding is flipped, via step 308. Step 309 returns the result encoding.

Figure 4:
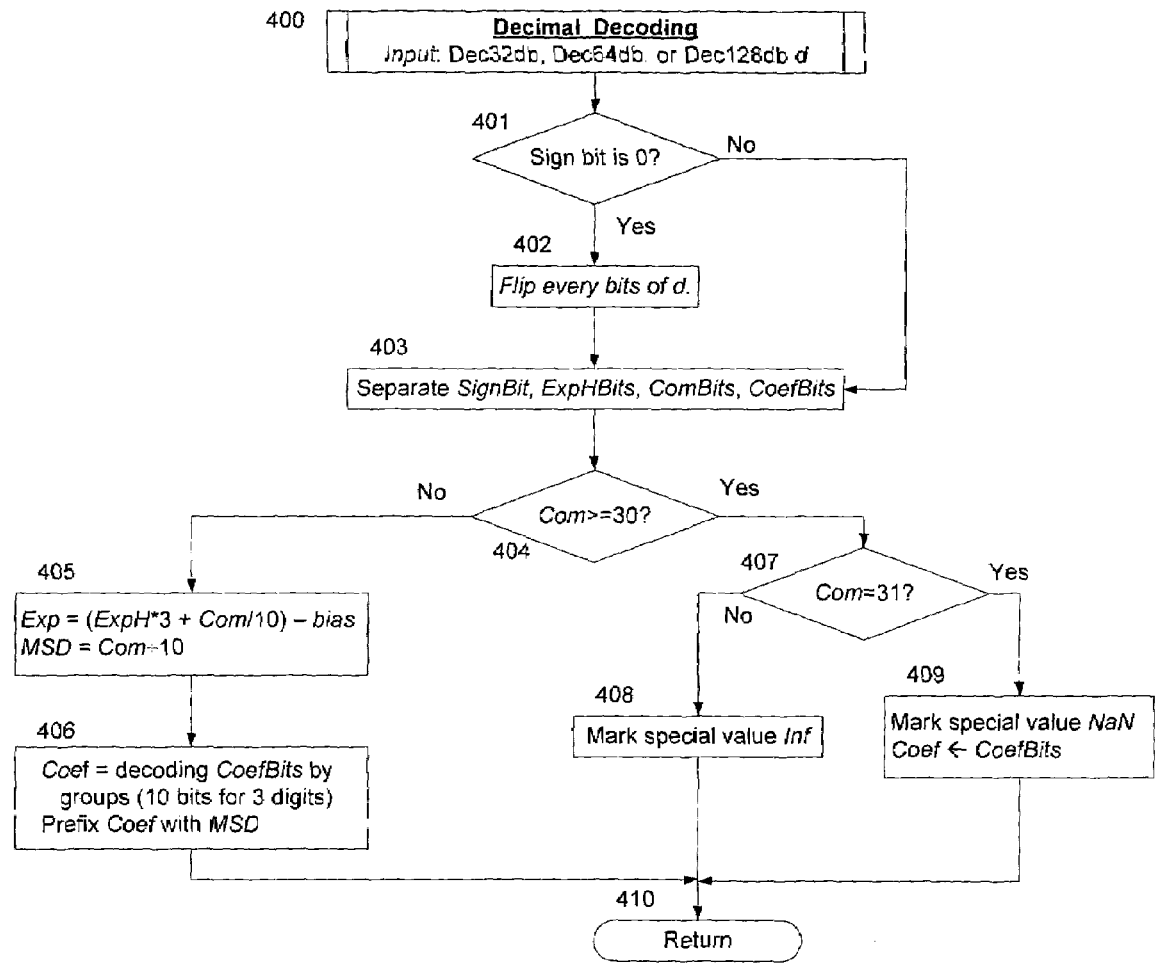
FIG. 4 is a flowchart illustrating the first embodiment of the order-preserving decoding scheme in accordance with the present invention, from the order-preserving format to a general decimal number.

FIG. 4 is a flowchart illustrating the first embodiment of the order-preserving decoding scheme in accordance with the present invention, from the order-preserving format to a general decimal number. Step 400 shows the input is a given encoded decimal d. First, the sign bit is checked to see if it is '0', via step 401. If yes, then d is negative, and every bit of d is flipped in step 402. In step 403, the encoding bits are separated into four parts: SignBit (sign bit), ExpHBits (exponent high bits), ComBits (combination 5 bits), and CoefBits (coefficient bits). In step 404, d is checked to see if it is a special value by checking the value of the combination field. For special values, the corresponding marks are made in steps 407, 408, and 409. For a NaN, its coefficient (Coef) is reconstructed from CoefBits. For a finite number, the exponent and the most significant digit of the coefficient are first computed in step 405, and then the rest of coefficient is decoded from CoefBits with 3 digits per 10 bits as in step 406. Step 410 returns the decimal encoded by d.

Note that in many cases, normalization will lose the original decimal representations, for example, 2.5, 2.500, and 2.50000 will be represented as one encoding. Depending on the data type, the needed representations can be recovered, as follows:

1) When it's used (in SQL) for data type FLOAT or DOUBLE, it has its normalized representation of scientific notation with "E", and the normalized value can be outputted without any extra information.

2) When it's used (in SQL) for data type DECIMAL, usually it is declared with precision and scale. As long as this information is remembered at the type level (such as column type), the decimals can be generated in the given precision and scale from the normalized encoding format.

3) When it's used as XML schema data type xs:decimal, it has its own canonical representation, which eliminates leading zeros and trailing zeros unless a zero is immediately before or after the required decimal point. For the data type xs:pDecimal in the proposed XML Schema 1.1 draft, which does preserve trailing zeros in the canonical form, we can use the normalized encoding plus the extra bytes to recover the original format.

For these situations, where the exact unnormalized numbers, such as 2.5, 2.500, and 2.50000, are kept without type information for precision and scale, or a canonical representation requirement, their encodings can be suffixed with one byte to indicate the scale, i.e. the number of digits after the decimal point, such as 1 (for 2.5), 3 (for 2.500), and 5 (for 2.50000). This extra byte is excluded from value comparison.

Using the proposed encoding method as shown in FIG. 3, 32, 64, or 128 bits can be used to encode any decimal number of decimal32, decimal64, or decimal128 formats respectively. Their values can be compared by comparing their encoding strings directly. Encoding a decimal in 64 bits or in 128 bits is similar to encoding in 32 bits except for the use of different lengths of exponent high bits (ExpH) and coefficient bits. Two extra bytes are needed for 64 and 128 bits for the precision to recover the original information.

FIG. 5 shows several examples of encoding decimal numbers into the order-preserving format in accordance with the present invention. The second column shows the normalized decimal expressions that have 7 digits of coefficients, and their exponents are in the range from −95 to 96. The third column Exp shows the adjusted exponents by adding the bias for decimal32, 101. The fourth column, ExpH, shows the values of dividing the values on Exp by 3. The remainders of the division are shown in column ExpL. The column, MSD, shows the most significant digit, while the values on Comb are the combination of the values on the previous two columns.

As illustrated in FIG. 5, the encoding for +NaN is all 1s, while the encoding for −NaN is all 0s for the first 12 bits. All finite numbers are between −Inf and +Inf. The encoding of a negative number is obtained by flipping all the bits of the encoding for its corresponding positive value. Both +0 and −0 have the same encoding since they are equal to 0 less than Ntiny and thus are assigned the same encoding by step 314 in FIG. 3.

It can be verified that values' comparison is consistent with the comparison of the encoding strings for the values in FIG. 5. The value relationships from their encodings can be obtained by byte-wise comparison:

$$-NaN<-Inf<-8.51*10^{-6}<-7.5*10^{-6}<-1234*10^{-101}<-0.1234*10^{-98}<-0<-+0<-7.5*10^{-6}<2345.678<2.3456789*10^{3}<+Inf<+NaN.$$

For example, the encoding for $-8.51*10^{-6}$ is less than the encoding for $-7.5*10^{-6}$ since the second byte 00111000 is less than 01001000.

For an example of the decoding scheme in accordance with the present invention, consider the last row in FIG. 5. Since the first bit is '0', every bit is switched, resulting in "10000100 00000000 00000100 11101010", where ExpH=2 and Comb=0. Thus Exp=ExpH*3+Comb/10-bias=6−101=−95, and MSD=Comb%10=0. The binary value of the first 10 bits of CoefBits "0000 000001" is 1. The binary value of the second 10 bits "00 11101010" is 234. The final coefficient is 0.001234. Therefore the decimal value is $-0.001234*10^{-95}$.

The encoding scheme in accordance with the present invention enables us to compare values efficiently without the overhead of decoding to another format. This makes the decimal numbers defined in the proposed IEEE 754r standard feasible in current computing machines. The ability to compare values in this manner provides particular advantage for databases. Data are encoded according to the present invention when stored in the database. The data can then be compared or sorted any number of times without the need to perform type-specific comparisons.

In a second embodiment, a decimal format is separated into its constituent parts and normalized. It is then reconstructed in the order sign, exponent, and coefficient. The amount by which the coefficient was shifted (the shift count) is added at the end in extra bits, giving the appropriate ordering for distinct representations and allowing the original decimal floating point (DFP) number to be reconstructed. Negative values are bit-wise inverted. This format uses one more byte than the DFP format.

FIG. 6 illustrates the length and content of the fields for a decimal32 conversion in accordance with the second embodiment of the encoding scheme of the present invention. The plus bit is an inverse of the IEEE 754r sign bit ('1' for positive numbers and non-negative zeros; '0' for negative numbers and negative zeros). The following description describes the encoding for when the plus bit=1. If the plus bit=0, then all remaining bits in the formats are inverted. The non-zero bit is '0' for a zero and '1' for everything else. Although not strictly necessary, it is used here to make checking for zero slightly easier, avoiding the need to move the exponent in the zeros case and conveniently shifts the exponent so that the first coefficient digit starts on a 4-bit boundary for the 64-bit and 128-bit formats. FIG. 7 is a chart illustrating the field size in bits for the corresponding IEEE 754r formats.

Figure 8:
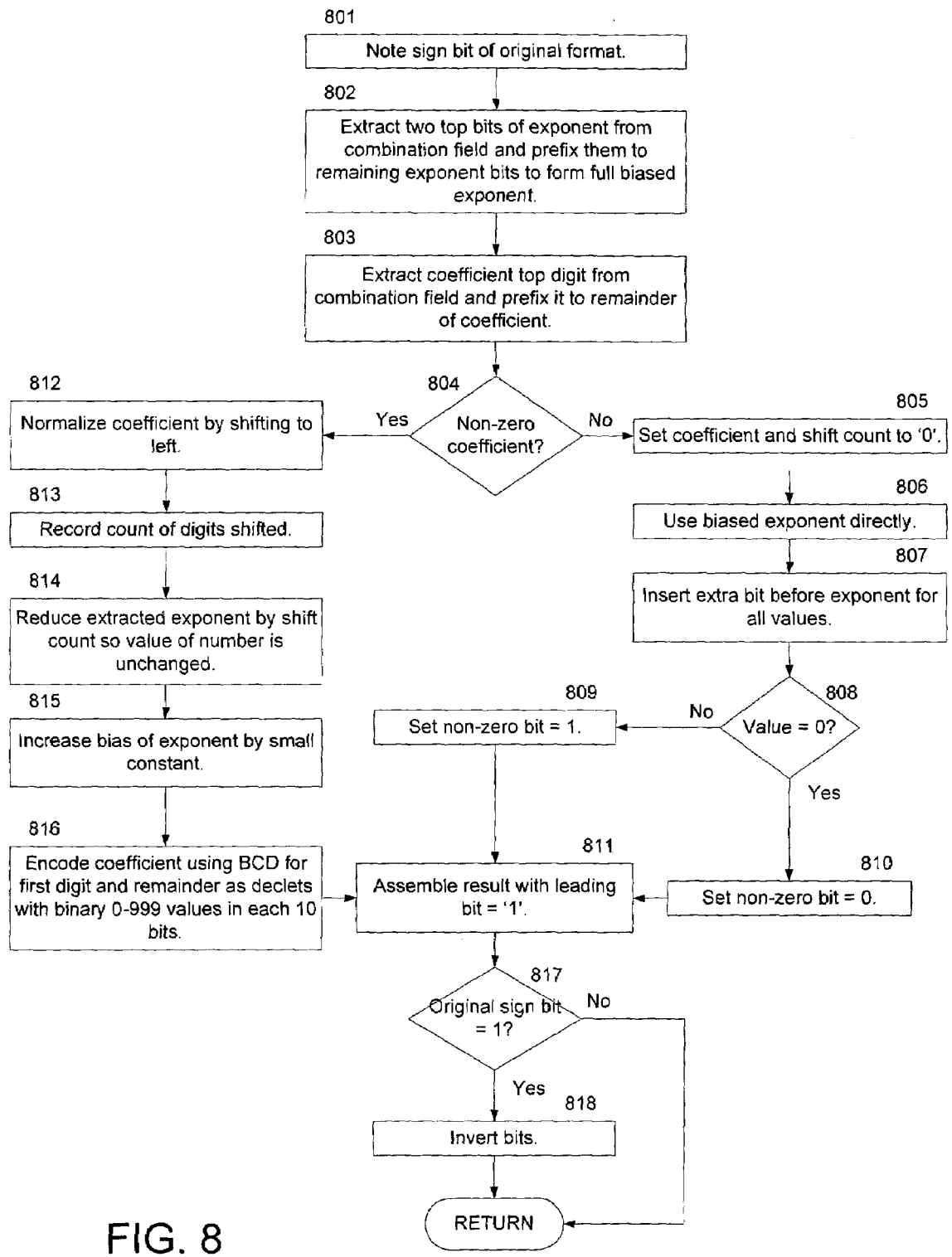
FIG. 8 is a flowchart illustrating the second embodiment of the order-preserving encoding scheme in accordance with the present invention.

FIG. 8 is a flowchart illustrating the second embodiment of the order-preserving encoding scheme in accordance with the present invention. First, the sign bit is noted, via step 801. Next, the two top bits of the exponent is extracted from the combination field and prefixed to the remaining exponent bits to form the full biased exponent, via step 802. Next, the coefficient top digit is extracted from the combination field and prefixed to the remainder of the coefficient, via step 803. Then, if the coefficient is non-zero, via step 804, it is normalized by shifting it to the left until the left-most digit is non-zero, via step 812. The count of digits shifted is recorded as a binary number, via step 813. The extracted exponent is then reduced by the shift count so that the value of the number (coefficient×$10^{exponent}$) is unchanged, via step 814. The bias of the exponent is also increased by a small constant (e.g. coefficient length) to avoid it going negative, via step 815. The coefficient is then encoded using BCD (Binary Coded Decimal) for the first digit and the remainder as declets with binary 0-999 values in each 10 bits, via step 816.

If the coefficient is zero, via step 804, the converted coefficient and shift count are each set to '0', via step 805, and the extracted exponent is used directly, via step 806. An available extra bit is then inserted before the exponent for all values of the original format, via step 807. This non-zero bit is set to '0' if the value is a zero, via step 808, 810, and set to '1' otherwise, via step 809. This forces the zeros to sort below all other values without having to move the exponent.

The result is then assembled with a leading bit of '1', via step 811, followed by the non-zero bit, the exponent, the normalized coefficient, and the shift count to form the sortable format. If the original sign bit was a '1' (i.e., a negative number), via step 817, then the all bits are inverted, via step 818. The leading bit for all negative numbers is therefore '0'.

In this embodiment, unpacking the combination field requires one extra bit, and the shift count requires at most 6 bits (3 bits for the 32 bit format, 4 bits for the 64-bit format, and 6 bits for the 128-bit format). These 7 extra bits fit into one additional byte, with one bit left over. This spare bit is used as the non-zero bit. Note that in this embodiment, the 3 bits of the shift count are unused in the decimal32 case, and 2 bits are unused in the decimal64 case. The field is the same size in all formats, however, it can be made right-aligned in the final byte to ease manipulation.

In this embodiment, special values are encoded by setting the top 8 bits of the order-preserving format (plus bit, non-zero bit, and 6 bits of the exponent field) to be the same as the original IEEE 754r top byte and inverting the seventh bit if the value is a NaN. The remaining bits of the exponent field are set to '0'. For infinities, and NaNs with a zero payload, the coefficient, and shift count are set to zero. For NaNs with a non-zero payload, the coefficient normalization and encoding and the shift count, are treated in exactly the same way as for non-zero finite numbers, with the initial top digit being assumed zero and the exponent being adjusted as usual.

For example, FIG. 9 illustrates the 64-bit order-preserving format for numbers 7.5, 7.50, and 7.500 in accordance with the second embodiment of the present invention. As illustrated, the number 7.50 in decimal64 format in hexadecimal is '22 30 00 00 00 00 03 D0'. In binary, it is:
sign=0
combination=01000
exponent continuation=10001100
coefficient continuation first four declets=0000000000
coefficient continuation rightmost declet=1111010000

The fields for the 64-bit order-preserving format are:
plus=1
non-zero=1
exponent=0110001111
coefficient top digit after shift=0111
coefficient first declet after shift=0111110100
coefficient remaining four declets=0000000000
shift count=001101 (13)

For the number 7.5, the shift count=001110 (14), and for the number 7.500, the shift count=001100 (12). For these three numbers, only the shift count is different. When normalized to the shortest coefficient, all three numbers, 7.5, 7.50, and 7.500, will result in 7.5. FIG. 10 illustrates an example pseudo-code for normalizing an order-preserving format to the shortest coefficient. For example, for the number 7.5, it will go to the section of code that handles finite non-zero numbers. Illustrated in FIG. 9, the shift count for 7.50 is 13. So the number of declets that can be skipped is 13/3=4 (skip $2^{nd}$, $3^{rd}$, $4^{th}$, $5^{th}$ declets), there are 4*3=12 zero digits. Then the first declet, which wasn't skipped, is converted to digits to become '500'. There are 2 rightmost zeros in '500'. The "number of zero digits at the rightmost of coeff"=12+2=14. The resultbuf shift count is thus 14. Since the original number is not negative, there is no need to inverse the number.

The decoding scheme of this embodiment is the reverse of the encoding scheme illustrated in FIG. 8.

Figure 11:
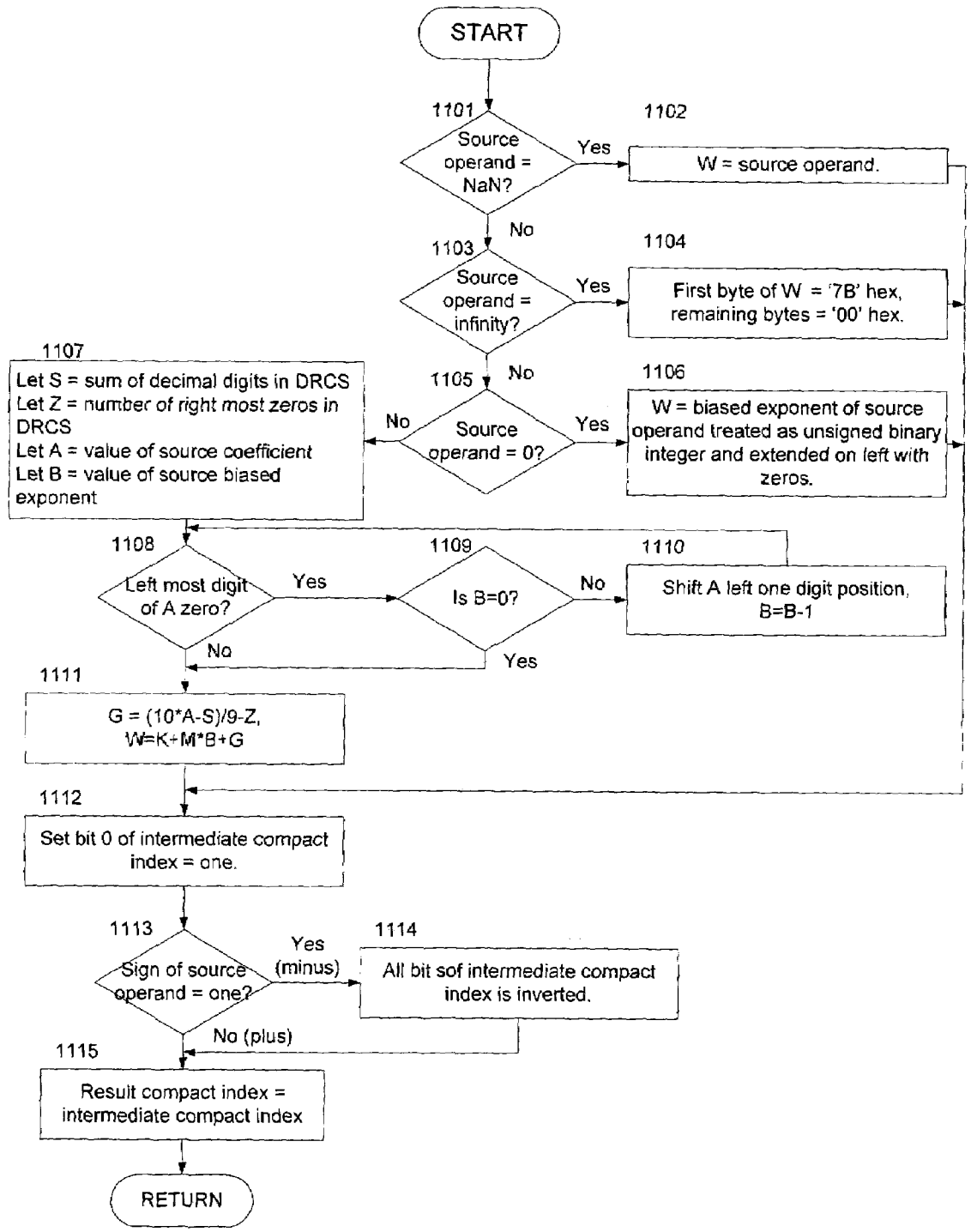
FIG. 11 is a flowchart illustrating a third embodiment of order-preserving encoding scheme in accordance with the present invention.

In a third embodiment, the DFP format (called the DFP source operand) is converted to an order-preserving format called a result compact index, where the result compact index is the same bit-size as the DFP source. FIG. 11 is a flowchart illustrating the third embodiment of order-preserving encoding scheme in accordance with the present invention. First, If the DFP source operand is a NaN, via step 1101, then all bits of the source are used unchanged as the intermediate compact index, via step 1102.

If the DFP source operand is an infinity, via step 1103, then the first byte of the intermediate compact index is set to '7B' hex and the remaining bytes are set to '00' hex, via step 1104.

If the DFP source operand is a zero, via step 1105, then the intermediate compact index is set to the value of the biased exponent of the DFP source operand treated as an unsigned binary integer and extended on the left with zeros, via step 1106.

If the DFP source operand is a finite nonzero number, then, via step 1107, then the sum (S) of the decimal digits and the number of rightmost zeros (Z) of the decimal representation of the source coefficient are computed, and an intermediate normalized number is initialized by setting its coefficient and biased exponent to that of the source operand. The intermediate number is normalized by shifting the coefficient left one digit position and reducing the biased exponent by one for each digit shifted until either the leftmost coefficient digit is nonzero or the biased exponent is zero, via steps 1108, 1109, and 1110.

Then in step 1111, a decade index (G) is set to the value (10*A−S)/9−Z, and an intermediate compact index (W) is set to the value K+M*B+G. Where A is the value of the adjusted coefficient, S is the sum of the decimal digits in the decimal representation of the coefficient of the DFP source operand, and Z is the number of rightmost zeros in the decimal representation of the coefficient of the DFP source operand, K is the normal offset, M is the biased exponent multiplier, B is the value of the biased exponent of the intermediate normalized number. The values of the normal offset (K) and the biased exponent multiplier (M) for each DFP format are shown in FIG. 12.

The result compact index is then formed from the intermediate compact index. First bit 0 of the intermediate compact index is set to one, via step 1112. Then, if the DFP source operand is one (minus), all bits of the intermediate compact index are inverted, via step s 1113 and 1114. Finally, the intermediate compact index is placed in the result compact index, via step 1115. FIG. 13 shows examples of encoding the six members of the cohort for the value 7.5, and the two nearest values, in the decimal32 format.

The compact index, although slower to generate than the other embodiments, takes no more space than the original DFP format. It also has the benefit of preserving all the information in NaNs, and contains all the information for reconstructing all members of a cohort.

Figure 14:
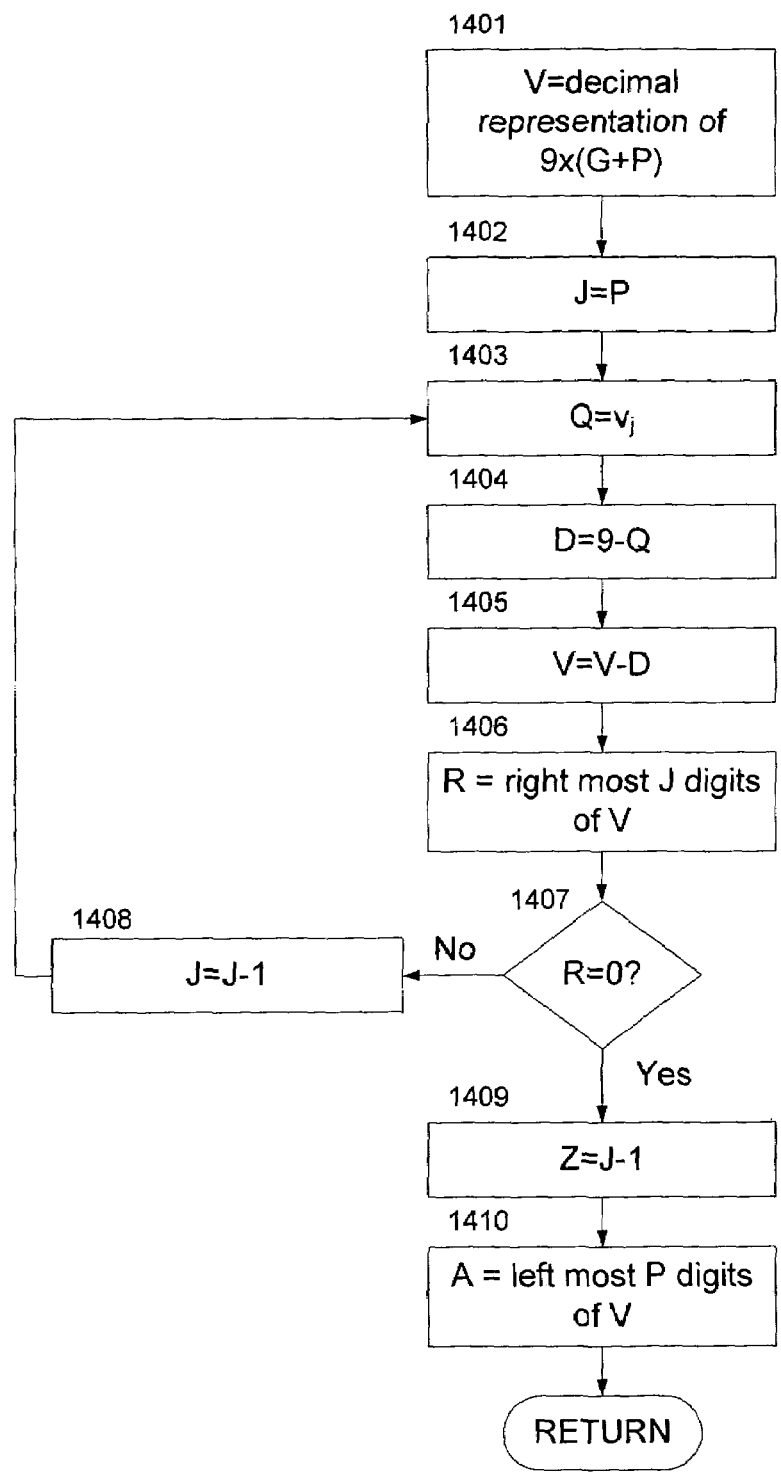
FIG. 14 is a flowchart illustrating the process, starting with the decade index (G), to derive the adjusted coefficient (A) and the number of rightmost zeros (Z) in accordance with the third embodiment of the present invention.

The decoding of a compact index to DFP is the inverse of the encoding steps, described above. This is a trivial process except for the inverse of step 1111, in which a decade index (G) was set to the value (10*A−S)/9−Z. FIG. 14 is a flowchart illustrating the process, starting with the decade index (G), to derive the adjusted coefficient (A) and the number of rightmost zeros (Z).

Step 1401 starts with the decade index (G), which is in binary representation, and P, which is the precision of the format. The precision P=7, 16, or 34, for decimal32, decimal64, or decimal128, respectively. The value P is added to G, the resulting sum is then multiplied by 9, and the product is converted to a decimal representation, called V. Digits in the decimal representation of V are numbered from right to left. Thus, for decimal32, the value of V, which is P+1 digits in size, is:

$$V = v_7 \times 10^7 + v_6 \times 10^6 + v_5 \times 10^5 + v_4 \times 10^4 + v_3 \times 10^3 + v_2 \times 10^2 + v_1 \times 10 + v_0.$$

In step 1402, the index value, J, is set to the value of the precision P. In step 1403, the temporary variable, Q, is set to the value of the Jth digit of V. In steps 1404 and 1405, the temporary variable D is set to the value of 9−Q, and then the temporary variable V is reduced by the value of D. These two steps 1404 and 1405 may be implemented as a combined single step.

In steps 1406 and 1407, the temporary variable R is set to the value of the rightmost J digits of V, and then this value is inspected for zero. Steps 1406 and 1407 may also be implemented as a combined single step.

If R is not zero, via step 1408, then the index value J is reduced by one, and the process continues at step 1403. If R is zero, via steps 1409 and 1410, then Z is set to the value of J− and A is set to the leftmost P digits of V.

FIG. 15, using the decimal32 format, gives several examples of deriving A and Z from G.

A method for conversion between a decimal floating-point number and an order-preserving format has been disclosed. The method may be implemented in a data processing system having a processor with the operations of the method being performed by the processor. Moreover, a tangible computer readable storage medium may be provided that comprises instructions stored thereon for performing the various operations of the method. As is generally known in the art, the term "tangible computer readable storage media" comprises any media that contains or stores instructions that are readable and executable by a computing device, examples of which include RAM, ROM, CD-ROM, CD-R/W, DVD-ROM, DVD-R/W, a hard drive, and the like. The method encodes numbers in the decimal floating point format into a format which preserves value ordering. This encoding allows for fast and direct string comparison of two values. Such an encoding provides normalized representations for decimal floating-point numbers and type-insensitive comparisons. Type-insensitive comparisons are often used in database management systems, where the data type is not specified for values to compare. In addition, the original decimal floating-point format can be recovered from the order-preserving format.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method, in a data processing system comprising a processor, for converting between a decimal floating-point number and an order-preserving format, the decimal floating-point number having a sign, a coefficient, an exponent, and a combination field, comprising:
    (a) adjusting, by the processor of the data processing system, the exponent, such that the coefficient has no leading zeros;
    (b) calculating, by the processor, exponent high bits, combination bits, and coefficient bits,
    wherein the exponent high bits is the exponent divided by three,
    wherein the combination bits is a combination of a remainder of the division of the exponent by three, with a most significant digit of the coefficient,
    wherein the coefficient bits is a grouping of the coefficient digits into groups of three digits, wherein each group of three digits is mapped to ten bits;
    (c) assembling, by the processor, in sequence a1, the exponent high bits, the combination bits, and the coefficient bits; and
    (d) inverting, by the processor, each of the assembled bits, if the decimal floating-point number is negative.

2. The method of claim 1, wherein the coefficient is normalized within a maximum coefficient length.

3. The method of claim 1, wherein the performing (a) further comprises:
    (a1) determining if the decimal floating-point number is too large for the order-preserving format; and
    (a2) converting the decimal floating-point number as infinity, if the normalized coefficient is too large for the order-preserving format.

4. The method of claim 1, wherein the performing (a) further comprises:
    (a1) determining if the decimal floating-point number is less than a least decimal; and
    (a2) converting the decimal floating-point number as zero, if the floating-point number is less than the least decimal.

5. The method of claim 1, wherein steps (a) and (b) are performed if the decimal floating-point number does not comprise a special value.

6. The method of claim 1, wherein if the decimal floating-point number comprises infinity, then the combination bits are set to '30' and the coefficient bits are each set to '1'.

7. The method of claim 1, wherein if the decimal floating-point number comprises a special value other than infinity, then the combination bits are set to '31' and the coefficient bits reflects bits of the coefficient.

8. The method of claim 1, wherein a conversion from the order-preserving format to the decimal floating-point number comprises a reverse of steps (a) through (d).

9. A tangible computer readable storage medium with program instructions stored thereon for converting between a decimal floating-point number and an order-preserving format, the decimal floating-point number having a sign, a coefficient, an exponent, and a combination field, comprising instructions for:
    (a) adjusting the exponent, such that the coefficient has no leading zeros;
    (b) calculating exponent high bits, combination bits, and coefficient bits,
    wherein the exponent high bits is the exponent divided by three,
    wherein the combination bits is a combination of a remainder of the division of the exponent by three, with a most significant digit of the coefficient,
    wherein the coefficient bits is a grouping of the coefficient digits into groups of three digits, wherein each group of three digits is mapped to ten bits;
    (c) assembling in sequence a1, the exponent high bits, the combination bits, and the coefficient bits; and
    (d) inverting each of the assembled bits, if the decimal floating-point number is negative.

10. The medium of claim 9, wherein the coefficient is normalized within a maximum coefficient length.

11. The medium of claim 9, wherein the performing (a) further comprises:
    (a1) determining if the decimal floating-point number is too large for the order-preserving format; and
    (a2) converting the decimal floating-point number as infinity, if the normalized coefficient is too large for the order-preserving format.

12. The medium of claim 9, wherein the performing (a) further comprises:
    (a1) determining if the decimal floating-point number is less than a least decimal; and
    (a2) converting the decimal floating-point number as zero, if the floating-point number is less than the least decimal.

13. The medium of claim 9, wherein instructions (a) and (b) are performed if the decimal floating-point number does not comprise a special value.

14. The medium of claim 9, wherein if the decimal floating-point number comprises infinity, then the combination bits are set to '30' and the coefficient bits are each set to '1'.

15. The medium of claim 9, wherein if the decimal floating-point number comprises a special value other than infinity, then the combination bits are set to '31' and the coefficient bits reflects bits of the coefficient.

16. The medium of claim 9, wherein a conversion from the order-preserving format to the decimal floating-point number comprises a reverse of instructions (a) through (d).

* * * * *